United States Patent [19]

Zuleeg

[11] 4,028,562
[45] June 7, 1977

[54] NEGATIVE IMPEDANCE TRANSISTOR DEVICE

[75] Inventor: Rainer Zuleeg, Huntington Beach, Calif.

[73] Assignee: McDonnell Douglas Corporation, Long Beach, Calif.

[22] Filed: June 16, 1975

[21] Appl. No.: 587,093

[52] U.S. Cl. .............................. 307/303; 307/249; 307/251; 331/115; 333/80 T; 357/43

[51] Int. Cl.² .................. H03K 17/60; H03B 17/00

[58] Field of Search .................. 307/249, 251, 303; 331/115, 112; 357/43; 333/80 T

[56] References Cited

UNITED STATES PATENTS

| | | | |
|---|---|---|---|
| 3,130,378 | 4/1964 | Cook, Jr. | 331/115 |
| 3,553,541 | 1/1971 | King | 307/249 |
| 3,636,470 | 1/1972 | Olivei et al. | 331/115 |

Primary Examiner—Stanley D. Miller, Jr.
Assistant Examiner—B. P. Davis

Attorney, Agent, or Firm—D. N. Jeu; Walter J. Jason; Donald L. Royer

[57] ABSTRACT

Transistor device exhibiting negative resistance characteristics includes an enhancement mode insulated gate field effect transistor interacting with an integral bipolar transistor. The transistor device has a bulk region separated from a shallow substrate region by a pn-junction located in proximity to source and drain regions of the field effect transistor. The source region also serves as the emitter, the substrate region serves as the base, and the bulk region serves as the collector of the integral bipolar transistor wherein the substrate base is left floating. Normally, the collector of the bipolar transistor is connected to the gate of the field effect transistor, and a resistor of finite value is included in the gate circuit. Oscillator, astable multivibrator, gated oscillator, gated astable multivibrator, and bistable multivibrator circuits are illustratively constructed with the transistor device.

10 Claims, 21 Drawing Figures

VERT. 1 mA/DIV
HORIZ. 2 VOLTS/DIV

VERT. 5 VOLTS/DIV
HORIZ. 10 μSEC/DIV

VERT. 5 VOLTS/DIV
HORIZ. 5 μSEC/DIV

VERT. 5 VOLTS/DIV
HORIZ. 100 μSEC/DIV

VERT. 5 VOLTS/DIV
HORIZ. 100 μSEC/DIV

NEGATIVE IMPEDANCE TRANSISTOR DEVICE

BACKGROUND OF THE INVENTION

My present invention relates generally to semi-conductor devices and, more particularly, to a negative impedance transistor device.

Negative impedance transistors based on bipolar transistor operation have been previously designed and fabricated. The base current in such transistors is controlled by a (base) surface field effect as described, for example, on pages 338 through 341 of Digest Paper 17.2 by R. E. Thomas, W. Chin and R. F. Haythornthwaite entitled "A Surface-Controlled Negative Impedance Transistor" and presented at the 1973 International Electron Device Meeting, Dec. 3–5, 1973 in Washington, D.C. The fabrication of these transistors to specifications is, however, very difficult because of a lack of adequate control of surface properties under present processing technology.

SUMMARY OF THE INVENTION

Briefly, and in general terms, my invention is preferably accomplished by providing a negative impedance transistor device which is based on unipolar transistor operation whereby a negative impedance control mechanism is readily available and implemented in a transistor structure that can be fabricated to specifications with excellent control of its electrical characteristics under present processing technology. This transistor device includes, for example, n-channel enhancement mode insulated gate field effect transistor and a bipolar transistor which is structurally integral with the field effect transistor.

The transistor device has an n-type bulk region separated from a shallow p-type substrate by a pn-junction which is located in close proximity to $n^+$-type source and drain contact diffusion regions of the field effect transistor. The source region also serves as the emitter, the shallow substrate serves as the base, and the bulk region serves as the collector of the integral bipolar transistor. The substrate base is left floating, and the collector of the bipolar transistor is normally connected to the dielectric gate of the field effect transistor. Of course, the transistor device can have a p-type bulk region separated from a shallow n-type substrate by a ph-junction which is located in close proximity to $p^+$-type source and drain contact diffusion regions of the field effect transistor.

In order for the negative impedance transistor device to function, a resistor of finite value is required in its gate circuit. The negative impedance or resistance effect is established by avalanche multiplication in the insulated gate field effect transistor channel, providing a base current input to the integral bipolar transistor. This base current is amplified by the amplification factor (beta) of the bipolar transistor and reduces the gate bias due to its voltage drop across the gate resistor. The negative resistance characteristic of the transistor device is therefore controlled by the gate-to-source resistance and the amplification properties of the integral bipolar transistor.

The shallow substrate base region of the bipolar transistor must be maintained in its fabrication in order to provide grounded emitter current gain above unity; otherwise, negative resistance could not be generated in the transistor device. The avalanche multiplication in the field effect transistor channel region at a critical voltage; i.e., field, applied between the source and drain is the triggering mechanism. Of course, both avalanche multiplication (current increase) in the field effect transistor and base current amplification in the bipolar transistor have to be functioning in order to obtain generation of the (controllable) negative resistance characteristic of the transistor device.

It may be noted that U.S. Pat. No. 3,753,055 of Akio Yamashita and Takashi Fujita for Field Effect Semiconductor Device granted Aug. 14, 1973 was developed during a novelty search on the present invention, and discloses and claims a field effect semiconductor device of high breakdown voltage and large current capacity having negative resistance characteristics which are controllable by an electric field. This device, however, yields an S-shaped negative resistance characteristic and its operation is based on the principle of controlling current flow of an pn-junction by means of a field effect transistor electrode. It is clearly different from the present invention.

BRIEF DESCRIPTION OF THE DRAWINGS

My invention will be more fully understood, and other advantages and features thereof will become apparent, from the following description of certain exemplary embodiments of the invention. The description is to be taken in conjunction with the accompanying drawings, in which.

DESCRIPTION OF THE PRESENT EMBODIMENTS

In the following description and accompanying drawings of certain exemplary embodiments of my invention, some specific dimensions and types of materials are disclosed. It is to be understood, of course, that such dimensions and types of materials are given as examples only and are not intended to limit the scope of this invention in any manner.

Figure 1:
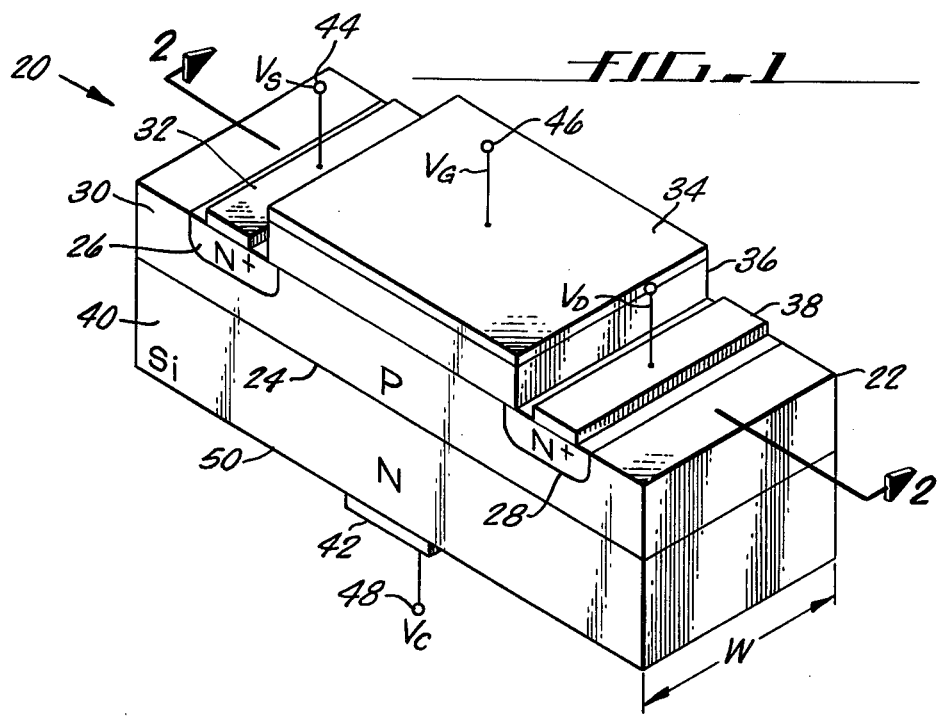
FIG. 1 is a frontal perspective view of a negative impedance transistor device constructed according to this invention.

FIG. 1 is a frontal perspective view, somewhat schematically shown and not accurately proportioned, of a negative impedance transistor device 20 constructed according to this invention. The device 20 generally comprises, for example, an n-channel enhancement mode insulated gate field effect transistor 22 having an additional pn-junction 24 in close proximity to the source and drain contact degenerate diffusion regions 26 and 28 of the insulated gate field effect transistor (IGFET).

More specifically, the transistor device 20 includes a shallow p-type substrate 30, source contact 32 to the n⁺-type diffusion region 26, gate contact 34 on top of a thin insulating layer 36, drain contact 38 to the n⁺-type diffusion region 28, n-type bulk region 40 separated from the p-type substrate by the pn-junction 24, and ohmic contact 42 to the n-type bulk region. The semiconductor material is silicon (Si) and the thin insulating layer 36 is silicon dioxide (SiO$_2$), for example.

The source contact 32 is connected to source/emitter terminal 44, gate contact 34 is connected to control gate terminal 46, and bulk region contact 42 is connected to collector terminal 48. The source region 26 also serves as the emitter, the shallow substrate 30 serves as the base, and the bulk region 40 serves as the collector of a bipolar transistor 50 in which the substrate base is left floating. The collector terminal 48 is normally connected to the gate terminal 46.

Figure 2:
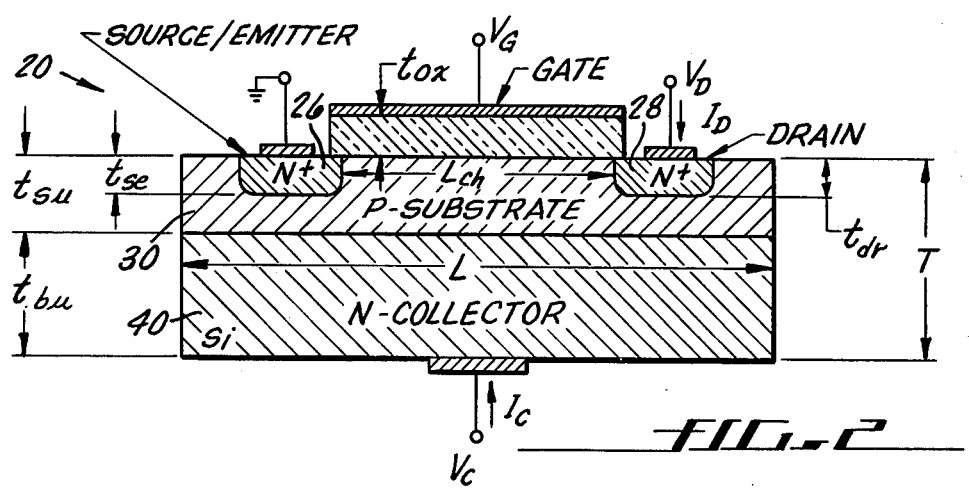
FIG. 2 is a sectional view of the negative impedance transistor device as taken along the line 2—2 indicated in FIG. 1.

FIG. 2 is a sectional view of the negative impedance transistor devive 20 as taken along the line 2—2 indicated in FIG. 1. Illustrative dimensions for the device 20 are as follows. Length L = 100 microns (um), width W = 200 um, and thickness T = 500 um. The gate oxide layer 36 thickness $t_{ox}$ = 1000 angstroms (A), bulk region 40 thickness $t_{bu}$ = 490 um, substrate 30 thickness $t_{su}$ = 8 to 10 um, source/emitter region 26 thickness $t_{se}$ = 6 to 8 um, and drain region 28 thickness $t_{dr}$ = 6 to 8 um. Channel length $L_{ch}$ = 2.5 to 10 um, for example. Donor concentration of the collector bulk region 40 can be in the range of $10^{15}$ to $10^{17}$ cm$^{-3}$ and acceptor concentration of the substrate region 30 can be in the range of $10^{15}$ to $10^{16}$ cm$^{-3}$. The source and drain contact diffusion regions 26 and 28 have a high carrier density of about $10^{19}$ to $10^{20}$ cm$^{-3}$.

Figure 3:
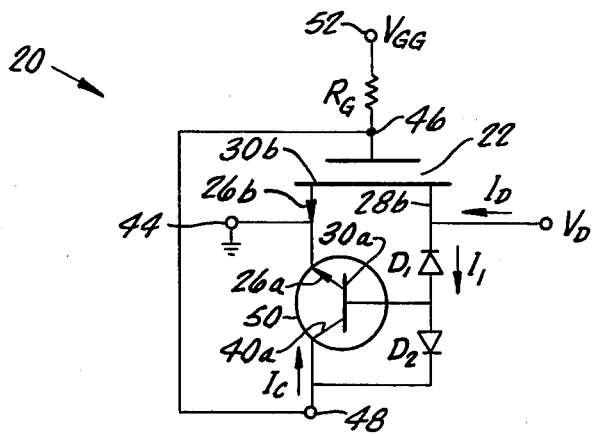
FIG. 3 is a circuit diagram of the equivalent circuit of the negative impedance transistor device.

FIG. 3 is a circuit diagram showing the equivalent circuit of the negative impedance transistor device 20 with its collector terminal 48 connected to the gate terminal 46. A resistor $R_G$ of a minimal finite value connects the gate terminal 46 in this instance to a source of voltage $V_{GG}$ at terminal 52. It can be seen that the device 20 comprises IGFET 22, bipolar transistor 50, diode D$_1$ and diode D$_2$. The bipolar transistor 50 includes an emitter 26a, base 30a and collector 40a. The emitter 26a is shown connected to the IGFET source 26b and the base 30a is connected by diode D$_1$ to the IGFET drain 28b and by diode d$_2$ to the collector 40a.

Of course, the emitter 26a of the bipolar transistor 50 and the source 26b of the IGFET 22 jointly share the diffusion region 26 of the device 20 shown in FIG. 2. The base 30a of the bipolar transistor 50 and the IGFET substrate 30b similarly share the shallow substrate region 30 shown in FIG. 2. The collector 40a of the bipolar transistor 50 corresponds to the portion of the bulk region 40 near the source/emitter diffusion region 26 shown in FIG. 2. The drain diode D$_1$ represents the drain diffusion region 28 coupled to the substrate region 30 and includes the inversion channel-to-substrate depletion layer in the IGFET 22. Similarly, the collector diode D$_2$ represents the substrate region 30 coupled to the portion of the bulk region 40 near the drain diffusion region 28.

Figure 4A:
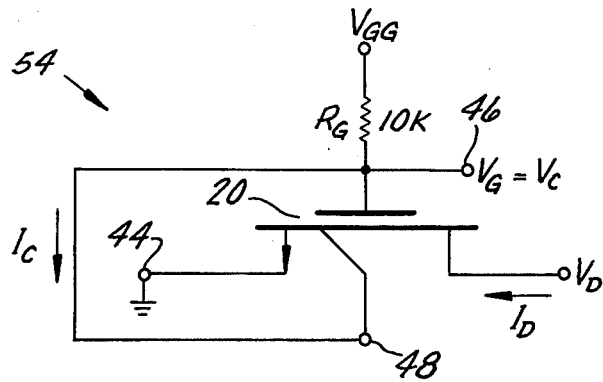
FIG. 4A is a circuit diagram of the negative impedance transistor device connected in a circuit for measurement of its characteristics.
Figure 4B:
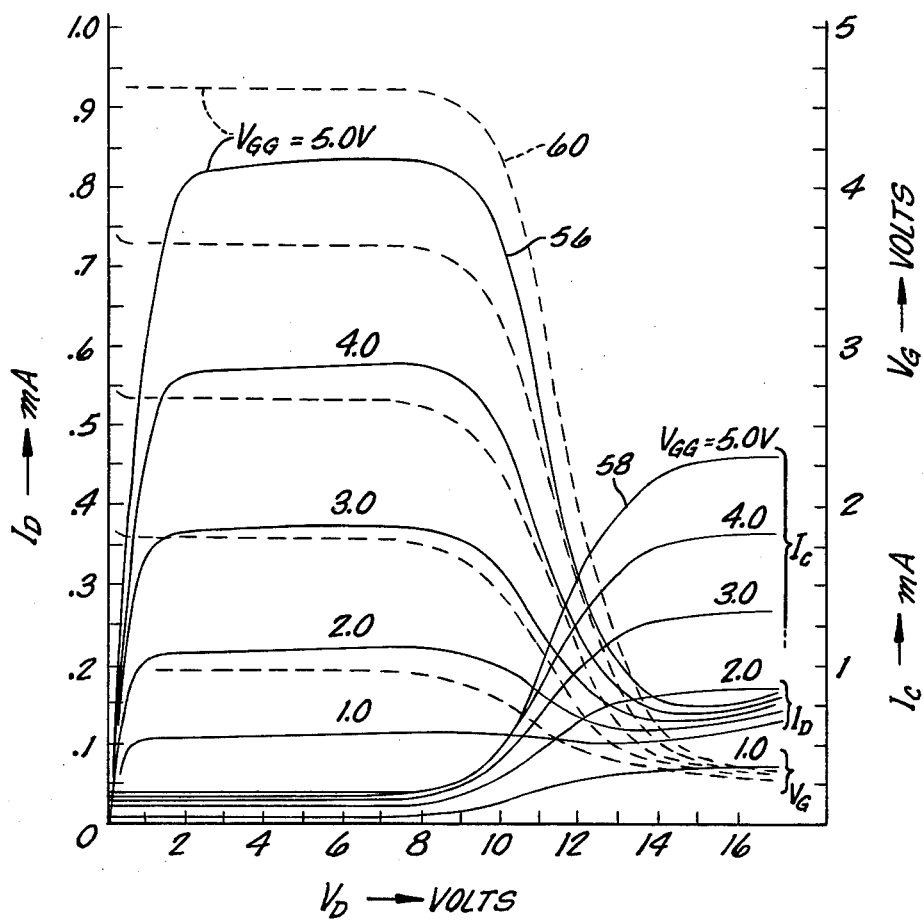
FIG. 4B is a graph showing plots of the characteristics measured in the circuit of FIG. 4A.

FIGS. 4A and 4B respectively show a circuit 54 in which the transistor device 20 is connected and a graph of the drain current $I_D$ versus drain voltage $V_D$ negative resistance characteristics 56 thereof. The n-shaped characteristics 56 are produced from normally shaped IGFET characteristics when the collector terminal 48 is tied to the gate terminal 46 as shown in FIG. 4A. The graph of FIG. 4B also shows (solid line) curves 58 of collector current $I_C$ and (broken line) curves 60 of gate voltages $V_G = V_{GG} - R_G I_C$. As indicated in FIG. 4A, resistor $R_G$ can have a resistance of 10 kilohms in the illustrated circuit.

Figure 5A:
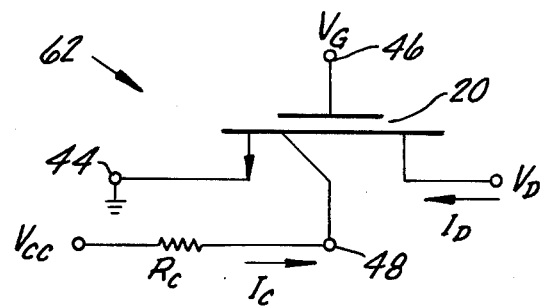
FIG. 5A is a circuit diagram of the negative impedance transistor device connected in another circuit for measurement of its characteristics.
Figure 5B:
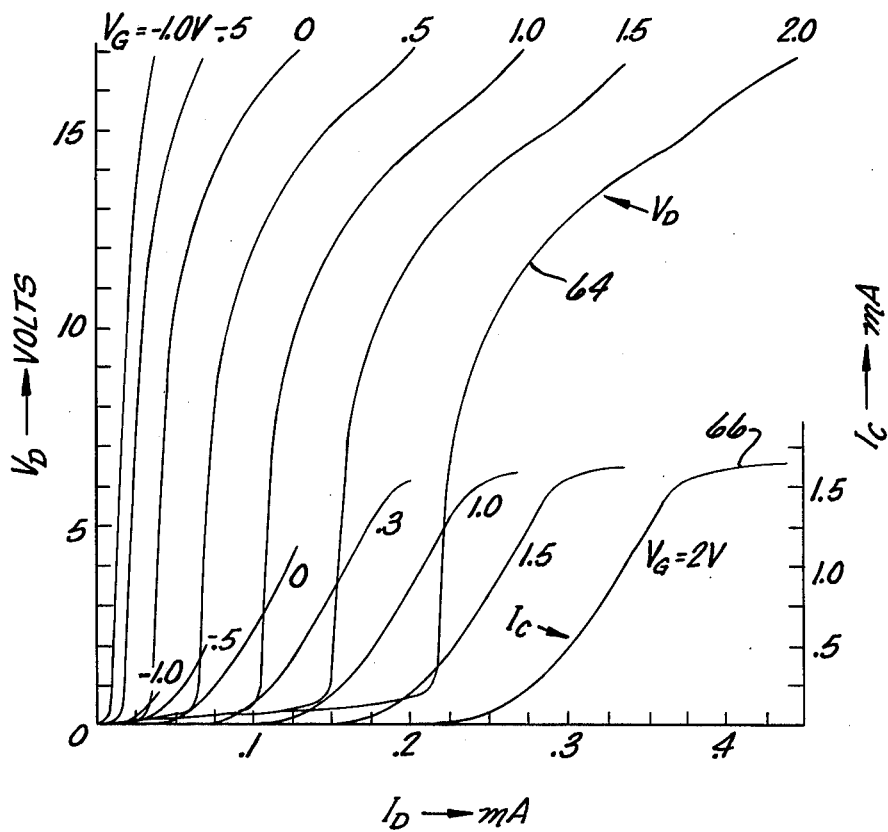
FIG. 5B is a graph showing plots of the characteristics measured in the circuit of FIG. 5A.

FIGS. 5A and 5B respectively show another circuit 62 in which the transistor device 20 is connected and a graph of the drain voltage $V_D$ versus drain current $I_D$ curves 64 for various gate voltages $V_G$. The graph of FIG. 5B also shows collector current $I_C$ versus drain current $I_D$ curves 66 for the various gate voltages $V_G$. The graph of FIG. 5B illustrates the dependence of drain voltage $V_D$ and collector current $I_C$ on drain current $I_D$ at various gate voltages $V_G$. The curves 64 and 66 are based upon values in the circuit 62 of FIG. 5A of $V_D$ = 5 volts, $V_{CC}$ = 2 volts and $R_C$ = 1 kilohm, for example.

In the circuit of FIG. 3 for generating the negative resistance characteristics 56 shown in FIG. 4B, collector current $I_C$ flows through resistor $R_G$, reduces the gate-to-source voltage (FIG. 4B, $V_G$ curves 60), and increases with drain voltage $V_D$ (FIG. 4B, $I_C$ curves 58). The negative resistance occurs by means of the transconductance $g_m$ of the IGFET 22:

$$dI_D/dV_D = \delta I_D/\delta V_D]_{V_G} + \delta I_D/\delta V_G]_{V_D} \cdot dV_G/dV_D \quad (1)$$
$$= \delta I_D/\delta V_D]_{V_G} - g_m R_G dI_C/dV_D$$

A minimal value for the great resistor $R_G$ arises from the requirement that the negative term exceed the positive incremental channel conductance. An upper limit for resistor $R_G$ is set by the desired frequency response.

Leakage current $I_1$ of diode $D_1$ flows into the p-type substrate 30 and generates the collector current $I_C = \beta I_1$ where $\beta$ is the amplification factor (beta) of the bipolar transistor 50. Breakdown of the channel induced between the source and drain regions 26 and 28 by the gate 34, sets in at drain voltages $V_D$ above 7 volts (FIG. 5B), enhancing $I_1$ and thereby also the collector current $I_C$ by means of $\beta = \delta I_C / \delta I_D = 20$, for example. Equation (1) can be rewritten as $$dI_D/dV_D = \delta I_D/\delta V_D]_{V_G} \text{short.} - \delta I_D/\delta V_D]_{V_G} \text{breakd.} \quad (2)$$
$$(g_m R_G \beta - 1)$$

where the drain current increase due to channel shortening (which does not enhance $I_C$) has been distinguished from that due to channel breakdown. Thus, measurement of $I_C$ can be used to discern between these two mechanisms for the drain current increase.

At sufficiently large drain voltages, the base (substrate 30) current becomes so large that the bipolar transistor 50 is driven into saturation. This occurs in FIG. 4B at drain voltages $V_D$ exceeding 15 volts. The collector-to-source voltage, equal to $V_G$, then approaches $V_{C,sat} \approx 0.3$ volt while the collector current $I_C$ tends toward the constant value $(V_{GG} = V_{C,sat})/R_G$. For drain voltages $V_D$ exceeding 15 volts, the drain current $I_D$ is the saturation current pertaining to the gate potential of approximately 0.3 volt enhanced by channel breakdown. For FIGS. 5A and 5B, the saturation collector current is $(V_{CC} - V_{C,sat})/R_C$.

Punch-through of the drain transistor encompassing the back-to-back drain and collector diodes $D_1$ and $D_2$ occurred at a drain voltage of 25 volts, for example, causing a large collector current $I_C$ to flow in a direction opposite to that for normal conditions. When this happens in the circuit of FIG. 4A, gate voltage $V_G$ and drain to source channel current increase rapidly. It is noted that the transistor device 20 can be used as a small signal amplifier just as the ordinary n-channel enhancement mode IGFET, and similar amplification characteristics are obtained.

It is also noted that collector current $I_C$ of the device 20 can be increased by photo-generation of electron-hole pairs or else by passing a base current through a contact to the p-type substrate 30 (FIG. 2). The substrate 30 can be suitably illuminated by light from one side, for example, to accomplish excess carrier injection by the electron-hole pairs created at the surface. It is particularly noted that, in view of the large amplification factor $g_m R_G \beta$ of the transistor device 20, it can be effectively adapted for use as a sensitive photodetector or light switch. As a switch, the adapted device 20 is in its "on" condition (high current state) in the dark and in its "off" condition (low current state) in the light.

In summary, the interaction of a bipolar transistor 50 with an insulated gate field effect transistor (IGFET) 22 in a transistor device 20 of novel geometry exhibits a negative impedance or resistance characteristic. This negative resistance is caused by channel breakdown current being amplified and inverted in the bipolar transistor 50 and fed through a gate resistor $R_C$, the function of which is to decrease the gate voltage $V_G$ and thereby to reduce the drain current $I_D$ by means of the IGFET transconductance $g_m$. A shallow or thin substrate (base) region 30 of the bipolar transistor 50 is maintained in the fabrication of the device 20 in order to provide grounded emitter current gain above unity. If this were not the case, then a negative resistance could not be generated. In order for the device 20 to function, a resistor of finite value is required in the gate circuit.

Figure 6A:
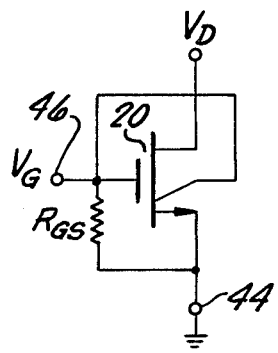
FIG. 6A is a circuit diagram of the negative impedance transistor device including a resistor connected between the gate and source of the transistor device.
Figure 6B:
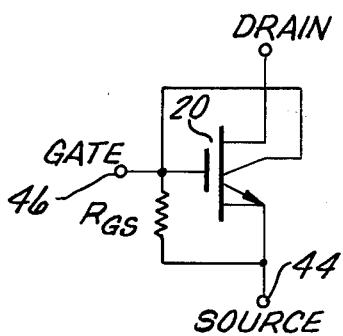
FIG. 6B is a circuit diagram similar to that of FIG. 6A except that a modified symbol for the negative impedance transistor device is used.
Figure 6C:
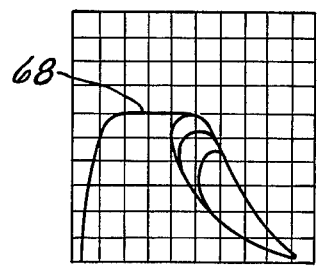
FIG. 6C is a graph showing a drain current versus drain voltage characteristic of the transistor device connected in the circuit of FIGS. 6A or 6B.

FIGS. 6A, 6B and 6C respectively show a circuit diagram of the transistor device 20 having a resistor $R_{GS}$ connected between gate and source terminals 46 and 44, another circuit diagram similar to that of FIG. 6A except that the transistor device symbol has been modified and a graph of the drain current versus drain voltage characteristic 68 of the transistor device with $V_G = 6$ volts and $R_{GS} = 1$ kilohm. The source terminal 44 is, of course, normally connected to ground in the circuits of FIGS. 6A and 6B. An oscillatory display is evident in the negative resistance region of the characteristic curve 68 in the graph of FIG. 6C.

It may be pointed out that the voltage controlled n-shaped negative resistance characteristic 68 shown in FIG. 6C is similar to that of a tunnel diode, so that all circuits possible with tunnel diodes can be duplicated with the transistor device 20 functioning as an active circuit element. The transistor device 20, however, has an inherent advantage over the tunnel diode in that the voltages are in the 1 to 30 volts range instead of 0.1 to 1.0 volt as for the tunnel diode. In addition, the current-voltage characteristic 68 and, of course, the characteristic peak voltage-to-current ratio or negative resistance value can be adjusted and varied over a wide range due to the availability of a control gate terminal 46 with the transistor device 20. Present laboratory devices 20 are limited in frequency response up to 10 megahertz (MHz) but improved devices would reach the microwave region of 1 to 5 gigahertz (GHz).

Figure 7A:
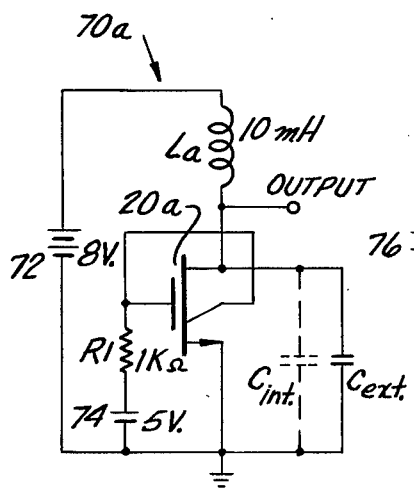
FIG. 7A is a circuit diagram showing the negative impedance transistor device connected in an oscillator circuit.
Figure 7B:
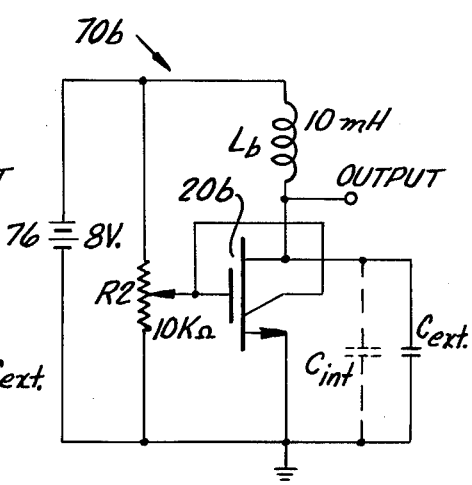
FIG. 7B is a circuit diagram showing the negative impedance transistor device connected in another oscillator circuit similar to that shown in FIG. 7A.
Figure 7C:
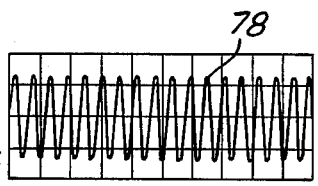
FIG. 7C is a graph showing a waveform illustrative of the output voltage of the oscillator circuit of FIGS. 7A or 7B.

FIGS. 7A, 7B and 7C respectively show a circuit diagram of an oscillator 70a including transistor device 20a and two power supplies 72 and 74, another circuit diagram of a similar oscillator 70b including transistor device 20b and one power supply 76, and a graph of a waveform 78 illustrative of the output voltage of either of the oscillators. In FIG. 7A, the drain of the transistor device 20a is connected to power supply 72 through an inductive load L$a$, and the gate is connected to power supply 74 through (gate) resistor R1. In FIG. 7B, the drain of the transistor device 20b is similarly connected to power supply 76 through an inductive load L$b$. The gate of the device 20b is, however, connected to the adjustable tap or tab of a potentiometer R2 which is connected across the power supply 76 and serves as a resistive voltage divider. The adjustment of the tab of the potentiometer R2 is made in such a way that, for a given load, the proper operating point is established. There is a threshold gate voltage for oscillation to start and then oscillation reaches a maximum amplitude with increasing gate voltage for a given device and load condition. Beyond this point, a further increase in gate voltage will cause a decrease in amplitude of oscillation. At a sufficiently high gate voltage, oscillation will finally cease.

In FIG. 7C, the output waveform 78 is that of oscillator 70a or 70b with a resonant frequency $f_{res} = 66$ kilohertz (KHz), for example. In the oscillators 70a and 70b, the resonance frequency $$f_{res} = \frac{1}{2}\pi \, [L_{ext} \, (C_{int} + C_{ext})]^{1/2} \qquad (3)$$

where $L_{ext}$ is the external inductance, $C_{int}$ is the internal capacitance, and $C_{ext}$ is the external capacitance in each oscillator. Of course, the external inductance $L_{ext}$ is essentially that of the inductive loads $La$ or $Lb$, the internal capacitance $C_{int}$ is essentially that of the transistor devices 20a or 20b, and the external capacitance $C_{ext}$ is essentially that of circuit stray capacitance or intentionally added capacitance. The internal capacitance $C_{int}$ is indicated in dash lines and the external capacitance $C_{ext}$ is indicated in solid lines in FIGS. 7A and 7B. Because of its negative resistance properties, the oscillators 70a or 70b gives very efficient operation (below cutoff frequency) as evidenced from the experimental results.

With an 8-volt power supply 72 or 76, a peak-to-peak output voltage of approximately 15 volts is obtained. With an inductive load $La$ or $Lb$ of 1 millihenry (mH), the frequency of oscillation with $C_{ext} = 7$ picofarod (pF) and $C_{int} = 20$ pF increases to 1 MHz as would be expected from equation (3). The output voltage was, however, reduced by 50%. The cutoff frequency of the oscillators 70a and 70b of FIGS. 7A and 7B, respectively, is about 10 MHz. It is noted that $C_{int}$ can be reduced to 2 pF with improved devices 20a and 20b so that with an inductive load $La$ or $Lb$ of 1 microhenry (uH), for example, a maximum frequency of oscillation of $$f_{max} = [\frac{1}{2}\pi(L_{ext} \, C_{int})^{1/2}]^{-1} \approx 100 \text{ MHz} \qquad (4)$$

results with the oscillators 70a or 70b.

Figure 8A:
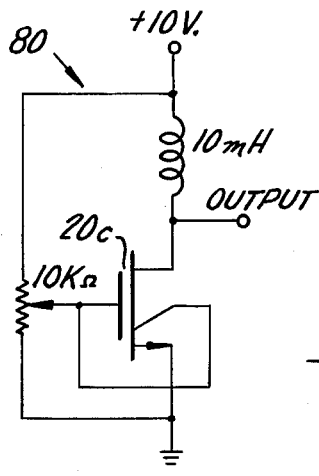
FIG. 8A is a circuit diagram of the negative impedance transistor device connected in an astable multivibrator circuit.
Figure 8B:
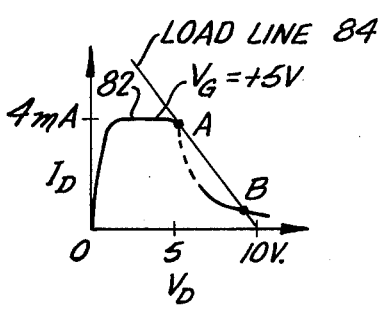
FIG. 8B is a graph showing a drain current versus drain voltage characteristic of the transistor device of FIG. 8A and the load line condition for a free-running multivibrator circuit.
Figure 8C:
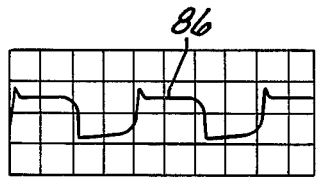
FIG. 8C is another graph showing a waveform illustrative of the output voltage of the astable multivibrator circuit of FIG. 8A.

FIGS. 8A, 8B and 8C respectively show a circuit diagram of an astable multivibrator 80 including a transistor device 20c, a graph of the drain current versus drain voltage characteristic 82 for the transistor device with a gate voltage $V_G = 5$ volts and illustrating a load line 84 condition for obtaining a free-running relaxation operation of the multivibrator, and another graph of a waveform 86 illustrating the output voltage of the multivibrator. The astable multivibrator 80 can be identical in circuitry to that of the oscillator 70b shown in FIG. 7B. The only difference is that a 10-volt power supply is used instead of an 8-volt one in order to adjust the load line 84 such that bistable operating points A and B are obtained on the characteristic 82. Because of the n-shaped negative resistance characteristic 82, it is possible by proper adjustment of the load line 84 to obtain an oscillatory or relaxation type of operation. This results in an astable or free-running multivibrator 80 with a generally square wave 86 output signal.

Figure 9A:
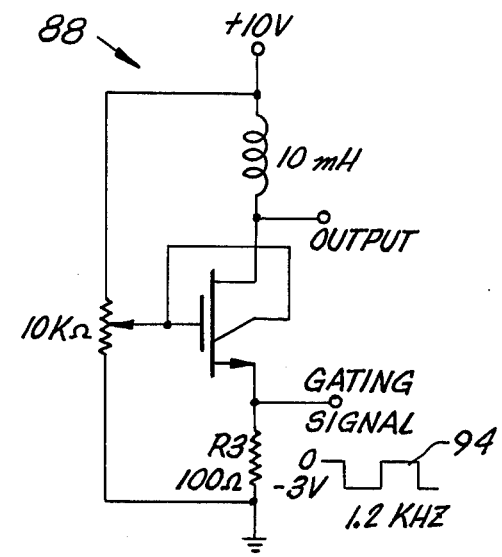
FIG. 9A is a circuit diagram of the negative impedance transistor device connected in a gated astable multivibrator (or gated oscillator) circuit.
Figure 9B:
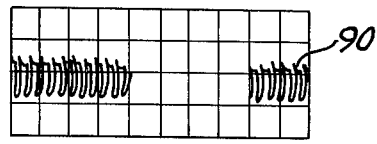
FIG. 9B is a graph showing a waveform of the output voltage of the gated oscillator circuit of FIG. 9A.
Figure 9C:
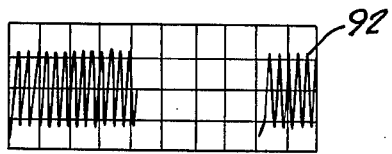
FIG. 9C is another graph showing a waveform illustrating the output voltage of the gated astable multivibrator circuit of FIG. 9A.

FIGS. 9A, 9B and 9C respectively show a circuit diagram of a gated astable multivibrator (or gated oscillator 88, a graph of a waveform 90 illustrating the output voltage of the gated astable multivibrator, and another graph of a waveform 92 illustrating the output voltage of the gated oscillator. The gated astable multivibrator (or gated oscillator) 88 is similar in circuitry to that of the astable multivibrator 80 shown in FIG. 8A except that a small resistor R3 of, for example, 50 to 500 ohms in value is inserted in the source lead of the transistor device 20d. A negative voltage is applied as a gating signal 94 across the resistor R3 to shift the load line and suppress the astable relaxation operation or oscillation as illustrated in FIGS. 9B and 9C, respectively.

Figure 10A:
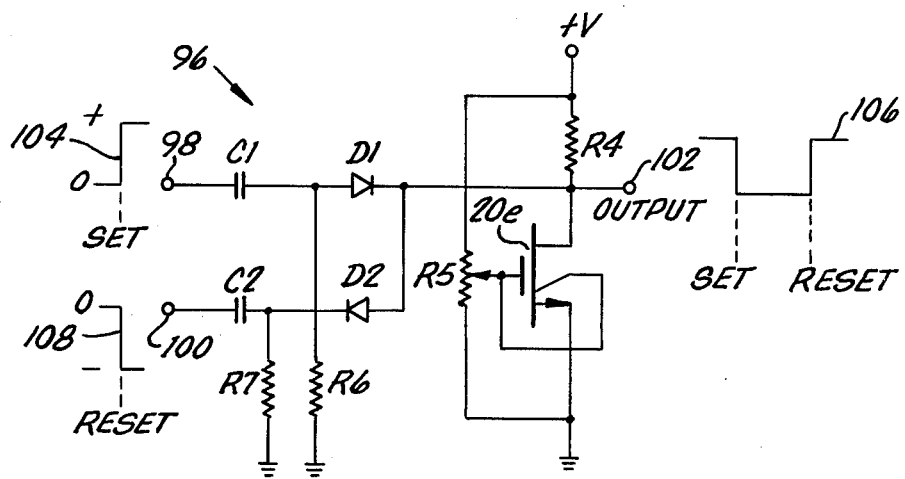
FIG. 10A is a circuit diagram of the negative impedance transistor device connected in a reset-set bistable multivibrator circuit.

FIG. 10A is a circuit diagram of a practical reset-set bistable multivibrator or R-S flip-flop 96. The drain of a transistor device 20e is connected to a supply voltage V through load resistor R4, and the gate of the transistor device is connected to the adjustable tab of a potentiometer R5 which is connected to the supply voltage as shown. A "set" terminal 98 is connected to the drain of the device 20e by capacitor C1 in series with diode D1. The junction between the capacitor C1 and diode D1 is connected to ground by resistor R6. Similarly, a "reset" terminal 100 is connected to the drain of the device 20e by capacitor C2 in series with diode D2. The junction between the capacitor C2 and diode D2 is also connected to ground by a resistor R7. Output terminal 102 is connected directly to the drain of the device 20e.

In operation, a positive pulse 104 to the set terminal 98 is differentiated by the capacitor C1-resistor R6 combination and applied through diode D1 to the drain of the device 20e. The device 20e is turned on so that its output voltage 106 goes low. When a negative pulse 108 is subsequently applied to the reset terminal 100, the negative pulse is differentiated by the capacitor C2-resistor R7 combination and passed by diode D2 to the drain of the device 20e. The device 20e is then turned off so that its output voltage 106 goes high again. The differentiating networks C1-R6 and C2-R7 can, of course, be omitted when positive and negative impulses of suitably short duration are used in place of the longer pulses 104 and 108.

Figure 10B:
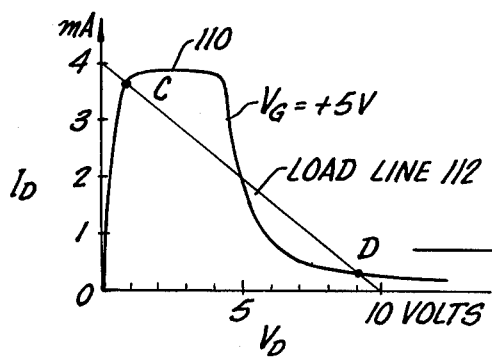
FIG. 10B is a graph showing a drain current versus drain voltage characteristic of the transistor device of FIG. 10A and the load line condition for proper bistable multivibrator operation.

FIG. 10B is a graph of the drain current versus drain voltage characteristics 110 for the transistor device 20e with a gate voltage $V_G = 5$ volts and illustrating a load line 112 condition for obtaining proper operation of the bistable multivibrator or flip-flop circuit 96. There is only one operating point for maximum output and a range of gate voltages; i.e., adjustable tab positions on potentiometer R5, for which this circuit 96 will properly function. The optimum point for operation is determined by the gate voltage (adjustable with the potentiometer R5) and the load R4 of a device 20e of specific transconductance; i.e., gain.

The load line 112 has to intercept the current-voltage characteristic 110 as indicated in FIG. 10B at two points C and D which give stable states of operation. For example, at stable operating point C (set state), $I_D \approx 3.5$ mA and $V_D = 1$ volt, and at stable operating point D (reset state), $I_D \approx 0.25$ mA and $V_D = 9$ volts.

The reset-set bistable multivibrator 26 of FIG. 10A is generally analogous to an R-S flip-flop described in, for example, the RCA Technical Manual TD-30 entitled "Tunnel Diodes for Switching and Microwave Applications." The bistable multivibrator 96 is designed and constructed with the transistor device 20e, however, and does not use a tunnel diode. Other circuits, linear and nonlinear, such as described and analyzed in the RCA Technical Manual TD-30 can be suitably implemented with the transistor device 20e instead of a tunnel diode. Improved voltage ranges is the main advantage.

While certain exemplary embodiments of this invention have been described above and shown in the accompanying drawings, it is to be understood that such embodiments are merely illustrative of, and not restrictive on, the broad invention and that I do not desire to be limited in my invention to the specific arrangements, circuits and constructions described and shown, for various modifications may occur to persons having ordinary skill in the art.

I claim:

1. A transistor device providing high gain performance and exhibiting negative impedance characteristics, said transistor device comprising:
   an enhancement mode insulated gate field effect transistor including a substrate region, a dielectric gate positioned over said substrate region, a source region, and a drain region which is spaced from said source region;
   a bipolar transistor structurally integral with said field effect transistor and including a base, an emitter, and a collector;
   a bulk region serving as said collector, said substrate region serving also as said base, and said source region serving also as said emitter;
   a pn-junction located in proximity to said source and drain regions, said substrate region being separated by said pn-junction from said bulk region and left floating as said base of said bipolar transistor, and said substrate region common to said field effect and bipolar transistors causing interaction therebetween to provide said high gain performance and generate said negative impedance characteristics; and
   a source and emitter contact to said source region, a drain contact to said drain region, and a collector contact to said bulk region, said collector contact being normally connected to said gate.

2. The invention as defined in claim 1 wherein said substrate region is a shallow region of predetermined thickness, and further comprising a resistance of finite predetermined value provided in a circuit including said gate therein.

3. The invention as defined in claim 1 wherein said field effect transistor is an n-channel enhancement mode insulated gate field effect transistor in which said substrate region comprises p-type material and said source and drain regions comprise $n^+$-type material, and said bulk region comprises n-type material.

4. The invention as defined in claim 2 further comprising a first supply voltage, a second supply voltage, and an inductive element connecting said drain contact to one polarity side of said first supply voltage, said finite resistance connecting one polarity side of said second supply voltage to said gate, and said source contact being connected to the other polarity sides of said first and second supply voltages whereby an oscillator circuit is obtained.

5. The invention as defined in claim 2 wherein said finite resistance includes a resistance potentiometer having an adjustable tab, and further comprising a supply voltage, and an inductive element connecting said drain contact to one polarity side of said supply voltage, said adjustable tab being connected to said gate, and said source contact being connected to the other polarity side of said supply voltage whereby an oscillator circuit is obtained.

6. The invention as defined in claim 5 wherein said supply voltage and said inductive element are selected with predetermined values to provide a load line condition whereby an astable multivibrator circuit is obtained.

7. The invention as defined in claim 5 further comprising a resistor connecting said source contact to said other polarity side of said supply voltage, and means for applying a gating signal across said resistor whereby a gated oscillator circuit is obtained.

8. The invention as defined in claim 6 further comprising a resistor connecting said source contact to said other polarity side of said supply voltage, and means for applying a gating signal across said resistor whereby a gated astable multivibrator circuit is obtained.

9. The invention as defined in claim 2 wherein said finite resistance includes a resistance potentiometer having an adjustable tab, and further comprising a supply voltage, a load resistor connecting said drain contact to one polarity side of said supply voltage, means for applying a reset signal to said drain contact, and means for applying a set signal to said drain contact, said adjustable tab being connected to said gate, and said source contact being connected to the other polarity side of said supply voltage whereby a reset-set bistable multivibrator circuit is obtained.

10. The invention as defined in claim 9 wherein said reset signal is of one polarity and said set signal is of another polarity, and said reset signal applying means includes unidirectional conducting means for applying said reset signal to said drain contact to reset said bistable multivibrator circuit and said set signal applying means includes unidirectional conducting means for applying said set signal to said drain contact to set said bistable multivibrator circuit.

* * * * *

UNITED STATES PATENT OFFICE
CERTIFICATE OF CORRECTION

PATENT NO. : 4,028,562
DATED : June 7, 1977
INVENTOR(S) : Rainer Zuleeg

It is certified that error appears in the above-identified patent and that said Letters Patent are hereby corrected as shown below:

Column 8, line 48, delete [26] and insert 96 therefor.

Signed and Sealed this

Twenty-third Day of May 1978

[SEAL]

Attest:

RUTH C. MASON
Attesting Officer

LUTRELLE F. PARKER
Acting Commissioner of Patents and Trademarks